United States Patent
Schuegraf

(10) Patent No.: US 6,683,366 B1
(45) Date of Patent: Jan. 27, 2004

(54) BIPOLAR TRANSISTOR AND RELATED STRUCTURE

(75) Inventor: Klaus F. Schuegraf, San Jose, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/163,386

(22) Filed: Jun. 4, 2002

(51) Int. Cl.[7] .................. H01L 27/082; H01L 27/102; H01L 31/11; H01L 21/8238; H01L 21/8222
(52) U.S. Cl. ................ 257/565; 257/197; 438/205; 438/340
(58) Field of Search ................... 257/565, 197; 438/205, 340

(56) References Cited

U.S. PATENT DOCUMENTS

| | | | | |
|---|---|---|---|---|
| 5,101,256 A | * | 3/1992 | Harame et al. | 257/565 |
| 5,789,800 A | * | 8/1998 | Kohno | 257/588 |
| 5,866,462 A | * | 2/1999 | Tsai et al. | 438/366 |
| 2002/0168829 A1 | * | 11/2002 | Bock et al. | 438/309 |

* cited by examiner

Primary Examiner—Tom Thomas
Assistant Examiner—Samuel Gebremariam
(74) Attorney, Agent, or Firm—Farjami & Farjami LLP

(57) ABSTRACT

According to one exemplary embodiment, a bipolar transistor, such as a heterojunction bipolar transistor ("HBT"), comprises a base having a top surface. The HBT further comprises a first inner spacer and a second inner spacer situated on the top surface of the base. The HBT further comprises a first outer spacer situated adjacent to the first inner spacer and a second outer spacer situated adjacent to the second inner spacer on the top surface of the base. According to this exemplary embodiment, the HBT further comprises an emitter situated between the first and second inner spacers. The HBT may further comprise an intermediate oxide layer situated on the first and second outer spacers. The HBT may further comprise an amorphous layer situated on said intermediate oxide layer. The HBT may also comprise an antireflective coating layer on the amorphous layer.

12 Claims, 5 Drawing Sheets

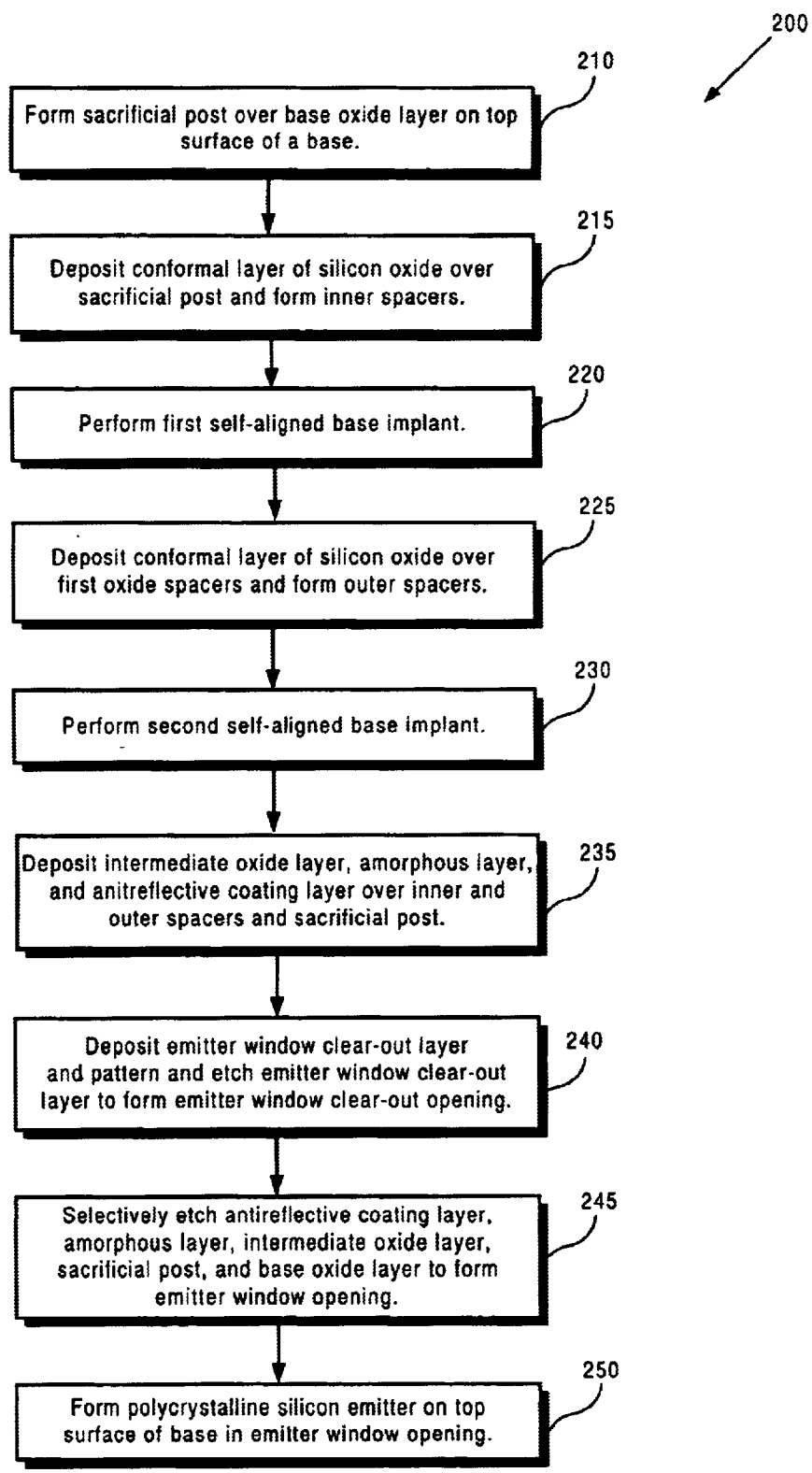

Figure 3C
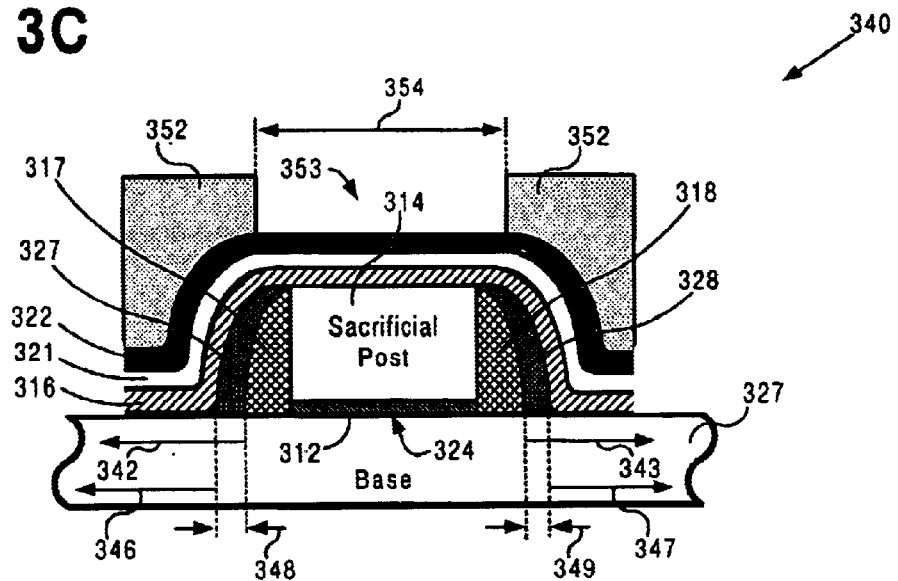
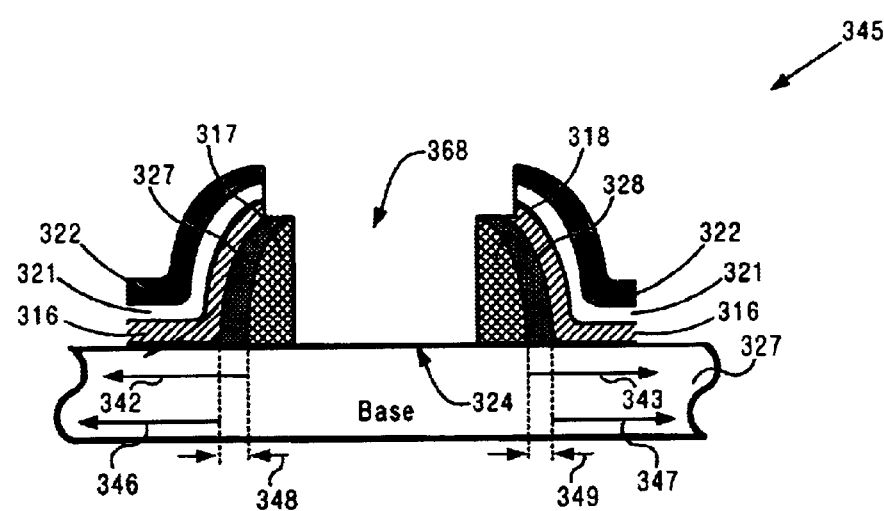
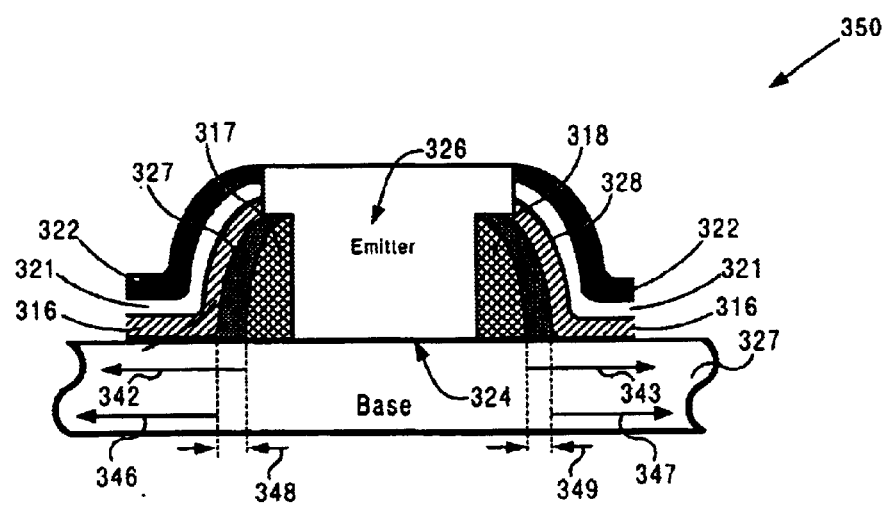

BIPOLAR TRANSISTOR AND RELATED STRUCTURE

BACKGROUND OF THE INVENTION

1. Field of the Invention

The present invention relates to the field of fabrication of semiconductor devices. More specifically, the invention relates to the fabrication of bipolar transistors.

2. Background Art

In one type of bipolar transistor, and more particularly a heterojunction bipolar transistor ("HBT"), used as an example in the present application, a thin silicon germanium ("SiGe") layer is grown as the base of the bipolar transistor on a silicon wafer. The SiGe HBT has significant advantages in speed, frequency response, and gain when compared to a conventional silicon bipolar transistor. Speed and frequency response can be compared by the cutoff frequency which, simply stated, is the frequency where the gain of a transistor is considerably reduced. Cutoff frequencies in excess of 100 GHz have been achieved for the SiGe HBT, which are comparable to the more expensive GaAs. Previously, silicon-only devices have not been competitive for use where very high speed and frequency response are required.

The higher gain, speed and frequency response of the SiGe HBT are possible due to certain advantages of silicon-germanium, such as a narrower band gap and reduced resistivity. These advantages make silicon-germanium devices more competitive than silicon-only devices in areas of technology where high speed and high frequency response are required. The advantages of high speed and high frequency response discussed above require, among other things, proper alignment of the SiGe HBT emitter window opening and minimal SiGe base resistance.

In a conventional approach for forming an emitter window opening in a SiGe HBT, two silicon dioxide ("oxide") spacers are formed on a base oxide layer on the top surface of a single-crystal SiGe base. A sacrificial post is formed between the two oxide spacers, followed by base ion implantation into the regions of the SiGe base not shielded by the sacrificial post and the oxide spacers. The sacrificial post and oxide spacers are then covered, for example, by a conformal layer of amorphous silicon.- Next, a layer of masking material, such as photoresist, is deposited over the conformal layer of amorphous silicon. An emitter window clear-out opening is then formed by patterning and etching an opening in the layer of masking material to expose the conformal layer of amorphous silicon. An emitter window opening is next formed by etching the conformal amorphous silicon layer and the sacrificial post. A base oxide layer in the emitter window opening is then etched to expose the top surface of the base. The emitter of the SiGe HBT is then formed by depositing, for example, polycrystalline silicon between the two oxide spacers on the top surface of the base. The resulting emitter has a width approximately equal to the width of the sacrificial post.

Ideally, the width of the emitter window clear-out opening is equal to the width of the sacrificial post. However, alignment tolerance must be taken into account since each photolithography tool utilized to pattern the emitter window clear-out opening is subject to some degree of misalignment. For example, if the emitter window clear-out opening is to be aligned with a 200.0 nanometer ("nm")-wide sacrificial post, a photolithography alignment tolerance of plus or minus 85.0 nm requires that the emitter window clear-out opening etched in the masking material have a width of at least 370.0 nm. However, as the width of the emitter window clear-out opening is increased, the risk of exposing the regions beyond the outer edge of the spacers and etching into the SiGe base is also increased. The resulting damage that can be caused by etching into the SiGe base detrimentally affects the performance of the SiGe HBT.

Conventional methods utilized in the fabrication of SiGe HBTs have not provided adequate photolithographic alignment margin without compromising the performance of the SiGe HBT. For example, to protect against the above risk of etching into the SiGe base, conventional methods typically increase the width of the spacers to fully contain the alignment tolerance range of the photolithography tool when patterning the emitter window clear-out opening. By increasing the width of the spacers, however, a greater portion of the underlying SiGe base is shielded from the subsequent base ion implantation step and, therefore, remains undoped. This increases the resistance of the SiGe base and adversely affects the performance of the SiGe HBT. Thus, conventional methods for controlling the photolithographic alignment margin in the fabrication of a SiGe HBT typically sacrifice SiGe base resistance in order to avoid the risk of damaging the SiGe base.

Thus, there is a need in the art for a bipolar transistor, such as a SiGe HBT, that provides improved alignment tolerance without undesirably decreasing performance.

SUMMARY OF THE INVENTION

The present invention is directed to method for improved alignment tolerance in a bipolar transistor and related structure. The present invention addresses and resolves the need in the art for improved alignment tolerance in a bipolar transistor, such as a SiGe HBT, without undesirably decreasing performance.

According to one exemplary embodiment, a bipolar transistor comprises a base having a top surface. The bipolar transistor, for example, may be an NPN silicon-germanium heterojunction bipolar transistor. The heterojunction bipolar transistor further comprises a first inner spacer and a second inner spacer situated on the top surface of the base. The first and second inner spacers, for example, may be silicon oxide. The heterojunction bipolar transistor further comprises a first outer spacer situated adjacent to the first inner spacer and a second outer spacer situated adjacent to the second inner spacer on the top surface of the base. The first and second outer spacers may be, for example, situated over an implanted dopant region of the base and may comprise silicon oxide. The implanted dopant may be, for example, boron.

According to this exemplary embodiment, the heterojunction bipolar transistor further comprises an emitter situated between the first and second inner spacers. The emitter may comprise, for example, polycrystalline silicon. The heterojunction bipolar transistor may further comprise an intermediate oxide layer situated on the first and second outer spacers. The intermediate oxide layer may comprise, for example, silicon oxide. The heterojunction bipolar transistor may further comprise an amorphous layer situated on said intermediate oxide layer. The amorphous layer may, for example, comprise amorphous silicon. The heterojunction bipolar transistor may further comprise an antireflective coating layer on the amorphous layer. The antireflective coating layer may, for example, comprise silicon oxynitride. In another embodiment, the present invention is a method that achieves the above-described bipolar transistor. Other features and advantages of the present invention will become more readily apparent to those of ordinary skill in the art after reviewing the following detailed description and accompanying drawings.

BRIEF DESCRIPTION OF THE DRAWINGS

FIG. 2 shows a flowchart illustrating the steps taken to implement an embodiment of the present invention.

FIG. 3C illustrates cross-sectional views, which include portions of a silicon wafer processed according to an embodiment of the invention, corresponding to certain steps of FIG. 2.

DETAILED DESCRIPTION OF THE INVENTION

The present invention is directed to method for improved alignment tolerance in a bipolar transistor and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
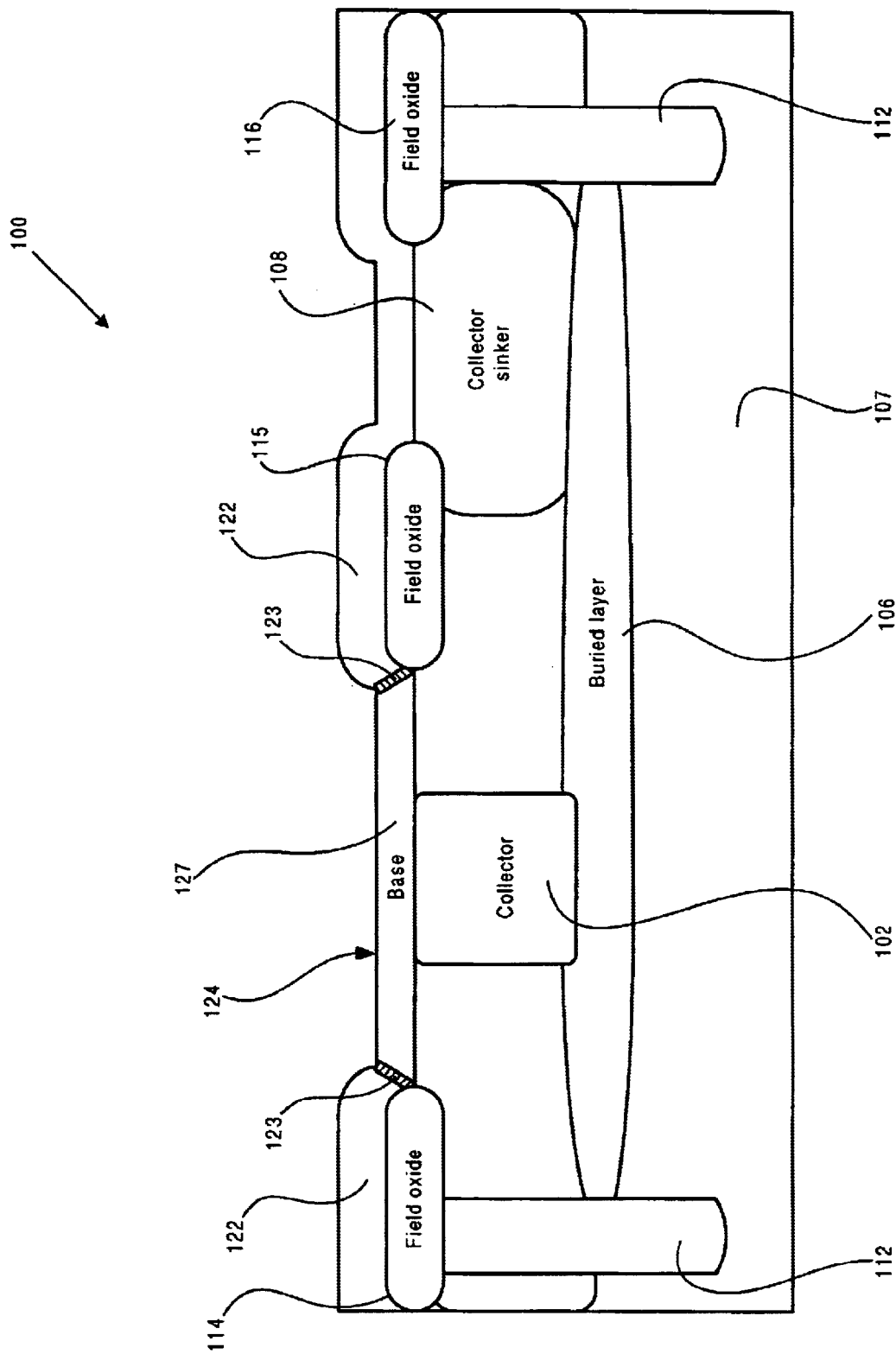
FIG. 1 illustrates a cross-sectional view of some of the features of an exemplary NPN HBT prior to application of the steps taken to implement an embodiment of the present invention.

FIG. 1 shows exemplary structure 100, which is utilized to describe the present invention. Certain details and features have been left out of FIG. 1, which are apparent to a person of ordinary skill in the art. Structure 100 includes collector 102 and base 127 for a SiGe heterojunction bipolar transistor ("HBT"). In the present embodiment, collector 102 is N-type single crystal silicon that can be formed using a dopant diffusion process in a manner known in the art. In the present embodiment, base 127 is P-type SiGe single crystal that might be deposited epitaxially in a LPCVD process. Base 127 may be implanted with boron ions to achieve the aforementioned P-type doping. As seen in FIG. 1, base 127 is situated on top of, and forms a junction with, collector 102. In the present embodiment, base contact 122 is polycrystalline SiGe that may be deposited epitaxially in a low-pressure chemical vapor deposition ("LPCVD") process. Base 127 and base contact 122 connect with each other at interface 123 between the contact polycrystalline material and the base single crystal material. Base 127 has a top surface 124.

As seen in FIG. 1, buried layer 106, which is composed of N+ type material, i.e. it is relatively heavily doped N-type material, is formed in silicon substrate 107 in a manner known in the art. Collector sinker 108, also comprised of N+ type material, is formed by diffusion of heavily concentrated dopants from the surface of collector sinker 108 down to buried layer 106. Buried layer 106, along with collector sinker 108, provide a low resistance electrical pathway from collector 102 through buried layer 106 and collector sinker 108 to a collector contact (the collector contact is not shown in any of the Figures). Deep trenches 112 and field oxide isolation regions 114, 115, and 116 may be composed of silicon dioxide ($SiO_2$) material and are formed in a manner known in the art. Deep trenches 112 and field oxide isolation regions 114, 115, and 116 provide electrical isolation from other devices on silicon substrate 107 in a manner known in the art. Thus, FIG. 1 shows that structure 100 includes several features and components used to form an HBT at a stage prior to formation of an emitter comprised of N-type polycrystalline silicon above base 127.

FIG. 2 shows flowchart 200, which describes the steps, according to one embodiment of the present invention, in the processing of a wafer that includes structure 100 of FIG. 1. Certain details and features have been left out of flowchart 200 that are apparent to a person of ordinary skill in the art. For example, a step may consist of one or more substeps or may involve specialized equipment or materials, as known in the art.

Steps 210 through 250 indicated in flowchart 200 are sufficient to describe one embodiment of the present invention, other embodiments of the invention may utilize steps different from those shown in flowchart 200. It is noted that the processing steps shown in flowchart 200 are performed on a wafer, which, prior to step 210, includes structure 100 shown in FIG. 1. In particular, the wafer includes top surface 124 of base 127 on which formation of an emitter comprised of N-type polycrystalline silicon is to take place in an "emitter window opening."

Figure 3A:
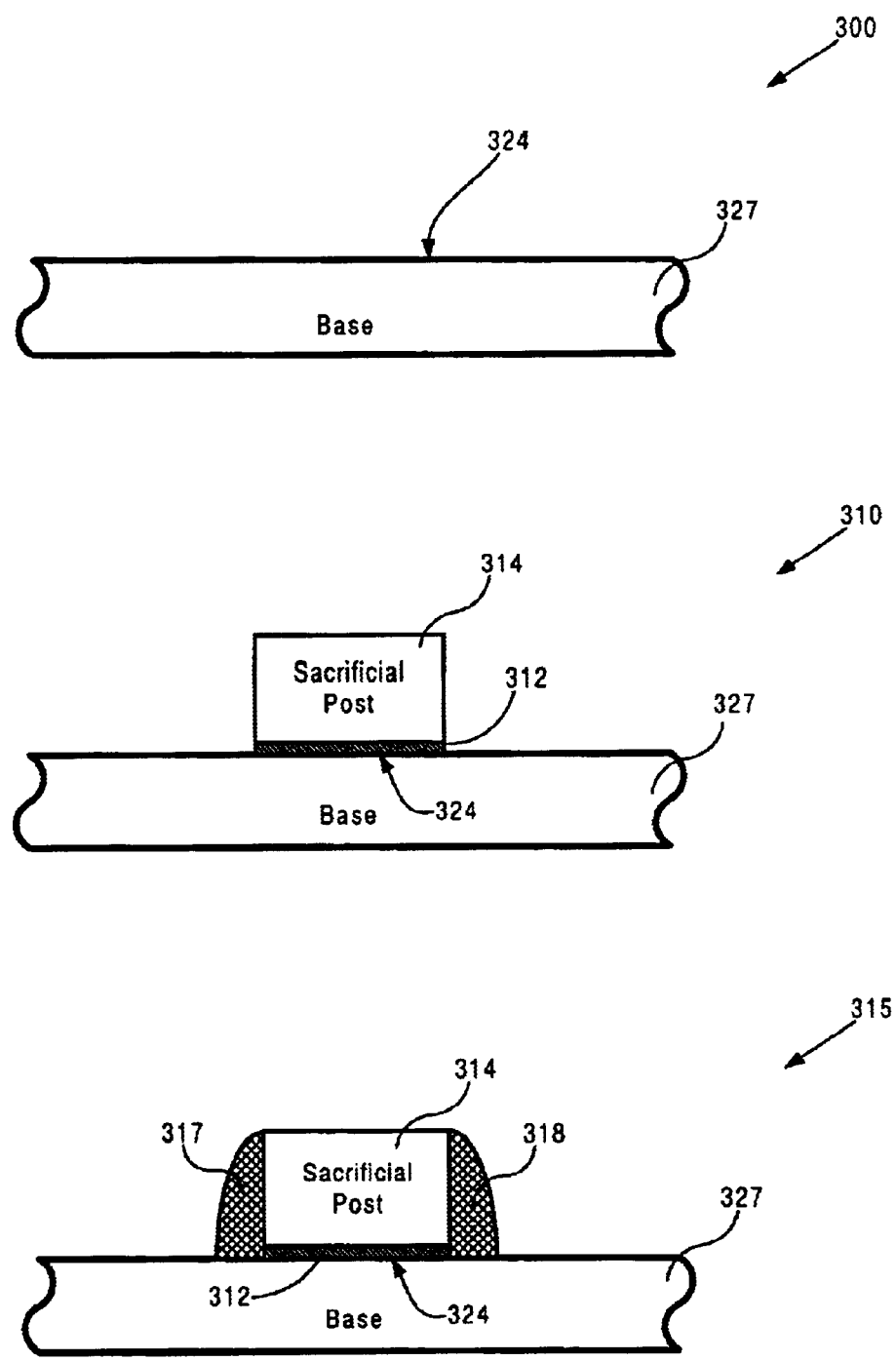
FIG. 3A illustrates cross-sectional views, which include portions of a silicon wafer processed according to an embodiment of the invention, corresponding to certain steps of FIG. 2.

Referring now to FIG. 3A, structure 300 of FIG. 3A shows a portion of structure 100 of FIG. 1. Base 127 and top surface 124 of structure 100 are shown in structure 300 as base 327 and top surface 324, respectively. For simplicity, other features such as base contact 122, interface 123, collector 102, buried layer 106, silicon substrate 107, collector sinker 108, deep trenches 112, and field oxide regions 114, 115, and 116, are not shown in structure 300. Structure 300 thus shows the portion of a wafer including top surface 324 of base 327, on which the formation of an emitter comprised of N-type polycrystalline silicon is to take place in an emitter window opening, before processing the wafer according to one embodiment of the invention shown in flowchart 200 of FIG. 2. In particular, structure 300 shows a portion of the wafer before processing step 210 of flowchart 200.

Figure 3B:
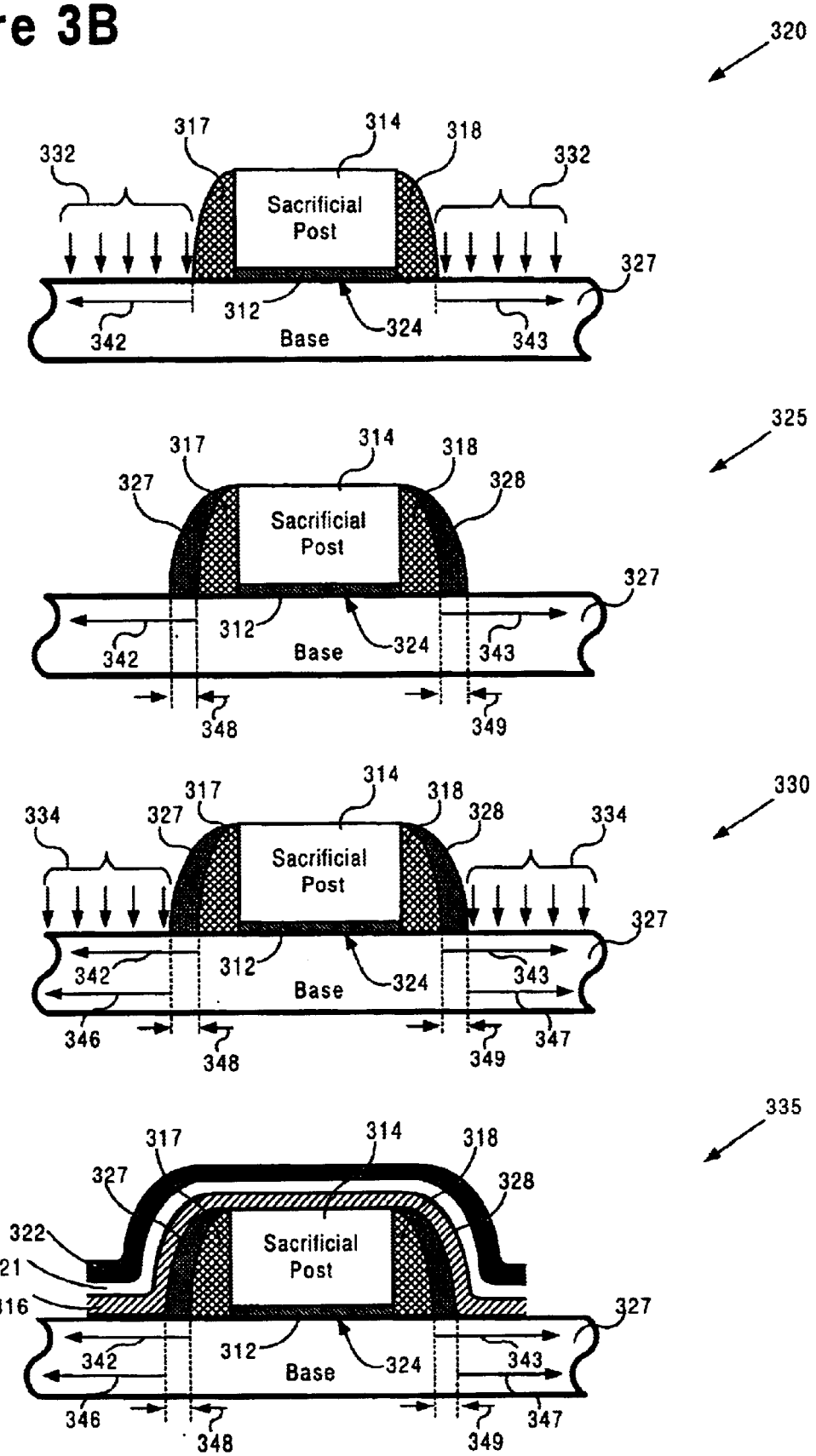
FIG. 3B illustrates cross-sectional views, which include portions of a silicon wafer processed according to an embodiment of the invention, corresponding to certain steps of FIG. 2.

Moreover, structures 310, 315, 320, 325, 330, 335, 340, 345, and 350 in FIGS. 3A, 3B, and 3C illustrate the result of performing, on structure 300, steps 210, 215, 220, 225, 230, 235, 240, 245, and 250 of flowchart 200 of FIG. 2, respectively. For example, structure 310 shows structure 300 after processing step 210, structure 315 shows structure 310 after the processing of step 215, structure 320 shows structure 315 after the processing of step 220, and so forth.

Continuing with step 210 in FIG. 2 and structure 310 in FIG. 3A, step 210 of flowchart 200 comprises the formation of a self-aligned sacrificial post, i.e. sacrificial post 314, over a silicon oxide (or "oxide") layer, i.e. base oxide layer 312, on top surface 324 of structure 300. Sacrificial post 314 acts as a sacrificial emitter post that is removed before deposition of the true emitter in a subsequent step. Moreover, sacrificial post 314 may be formed by patterning and etching a layer of polysilicon, which may be deposited over base oxide layer 312 by chemical vapor deposition ("CVD"), as known in the art. It is noted that silicon oxide is also referred to as "oxide" in the present application. Base oxide layer 312 may be formed by patterning and etching a layer of silicon oxide, which may be deposited in a LPCVD process at a temperature of approximately 650.0 to 700° C., for example. In one embodiment, base oxide layer 312 has a thickness of approximately 100.0 Angstroms, and acts as an etch stop layer that provides control for a subsequent etch step. The result of step 210 of flowchart 200 is illustrated by structure 310 in FIG. 3A.

Referring to step 215 in FIG. 2 and structure 315 in FIG. 3A, at step 215 of flowchart 200, a conformal layer of silicon oxide is deposited over sacrificial post 314.

The deposited conformal layer of silicon oxide is etched back to form a pair of oxide spacers, i.e. inner spacers 317 and 318. For example, inner spacers 317 and 318 can be formed by anisotropically etching the conformal layer of silicon oxide using a chlorine based etchant, e.g. a $CF_4CHF_3$ etch. The height and width of inner spacers 317 and 318 may be controlled for example, by the height of sacrificial post 314 and the thickness of the deposited silicon oxide layer, respectively.

The anisotropic etch utilized to form inner spacers 317 and 318 is selective to sacrificial post 314. In other words, the anisotropic etch will not erode sacrificial post 314. However, the anisotropic etch does not have a high oxide-to-silicon etch selectivity, resulting in the etching of base 327 in the regions beyond the outer edge of inner spacers 317 and 318. Approximately 75.0 to 100.0 Angstroms of silicon may be etched off top surface 324 of SiGe base 327, for example. Since SiGe base 327 contains P-type dopant, e.g. boron, there is a loss of boron ions during the etch-back of inner spacers 317 and 318 in step 215. In the present embodiment, inner spacers 317 and 318 may be formed from a layer of silicon oxide that is deposited in a plasma enhanced chemical vapor deposition ("PECVD") process at approximately 450.0° C. Referring to FIG. 3A, the result of step 215 of flowchart 200 is illustrated by structure 315.

Continuing with step 220 in FIG. 2 and structure 320 in FIG. 3B, at step 220 of flowchart 200, a self-aligned base implant is performed, i.e. first base implant 332. For example, first base implant 332 can be performed by implanting dopant ions into implant regions 342 and 343 of top surface 324 of base 327, which are "extrinsic base regions." Implant regions 342 and 343 extend outward from the outside edge of inner spacers 317 and 318, respectively, and designate the portion of top surface 324 of base 327 that is exposed to first base implant 332. The portions of base 327 underlying inner spacers 317 and 318 and sacrificial post 314, however, are shielded from first base implant 332. By the implantation of dopant ions in base 327, first base implant 332 reduces the resistance of base 327, and thereby improves the electrical performance of base 327. Furthermore, first base implant 332 re-introduces dopant ions into base 327 that were lost during the formation of inner spacers 317 and 318 in step 215, as described above. In one embodiment of the present invention, first base implant 332 may be a shallow, P-type boron implant. Referring to FIG. 3B, the result of step 220 of flowchart 200 is illustrated by structure 320.

Referring to step 225 in FIG. 2 and structure 325 in FIG. 3B, at step 225 of flowchart 200, a conformal layer of silicon oxide is deposited over sacrificial post 314 and inner spacers 317 and 318. The deposited conformal layer of silicon oxide is etched back to form a second pair of oxide spacers, i.e. outer spacers 327 and 328. Outer spacers 327 and 328 are situated adjacent to inner spacers 317 and 318, respectively. The formation of outer spacers 327 and 328 effectively increases the width of inner spacers 317 and 318 by forming one set of wider spacers. In other words, inner spacer 317 and outer spacer 327 effectively form one wide spacer, and inner spacer 318 and outer spacer 328 effectively form another wide spacer. The width of outer spacers 327 and 328, measured along top surface 324 of base 327, is represented by outer spacer widths 348 and 349, respectively. Outer spacers 327 and 328 provide additional protection for base 327 during the processing steps following the opening of an emitter window clear-out layer 352 in a subsequent step. In other words, outer spacers 327 and 328 advantageously provide additional photolithographic alignment margin for the opening of the emitter window clear-out layer.

Outer spacers 327 and 328 can be formed, for example, by anisotropically etching the conformal layer of silicon oxide using a chlorine based etchant, e.g. a $CF_4CHF_3$ etch. The anisotropic etch utilized to form outer spacers 327 and 328 is selective to sacrificial post 314. In other words, the anisotropic etch will not erode sacrificial post 314. However, as in step 215, the etch in step 225 does not have a high oxide-to-silicon etch selectivity, resulting in some etching of top surface 324 of base 327. Approximately 75.0 to 100.0 Angstroms of silicon may be etched off the top surface 324 of SiGe base 327, for example. In the present embodiment, outer spacers 327 and 328 may be formed from a layer of silicon oxide that is deposited in a PECVD process. Referring to FIG. 3B, the result of step 225 of flowchart 200 is illustrated by structure 325.

Continuing with step 230 in FIG. 2 and structure 330 in FIG. 3B, at step 230 of flowchart 200, a second self-aligned base implant is performed, i.e. second base implant 334. Second base implant 334 may be performed in a similar manner to first base implant 332 described above, e.g. with the same type of implant ions and at substantially same energy level. Dopant ions are implanted into implant regions 346 and 347 of top surface 324 of base 327, which are "extrinsic base regions." Implant regions 346 and 347 extend outwardly from the outside edge of outer spacers 327 and 328, and designate the portion of top surface 324 of base 327 that is exposed to second base implant 334. The portions of SiGe base 327 underneath inner spacers 317 and 318, outer spacers 327 and 328, and sacrificial post 314, however, is shielded from second base implant 334. It is noted that in step 225, the portions of base 327 represented by outer spacer widths 348 and 349 were subject to first base implant 332, and are therefore already doped. As a result of the implantation of dopant ions in second base implant 334, the resistance of base 327 is further decreased. Furthermore, second base implant 334 re-introduces dopant ions into base 327 that were lost during the formation of outer spacers 327 and 328 in step 225. In one embodiment of the present invention, second base implant 334 may be a shallow, P-type boron implant.

In the present embodiment, as described above, a first pair of spacers is formed in step 215 (inner spacers 317 and 318), followed by first base implant 332 in step 220, and a second pair of spacers is formed (outer spacers 327 and 328) in step 225, followed by second base implant 334 in step 230. In another embodiment, the aforementioned sequence of spacer formation followed by ion implantation may be repeated as many times as required to achieve a desired spacer width. Thus, the present invention advantageously achieves an increase in photolithographic alignment margin without compromising the doping of base 327, i.e. without increasing the resistance of base 327 and adversely affecting the performance of the SiGe HBT device. As a result, the present invention advantageously achieves greater control over the doping and resistance of base 327, while improving manufacturability of the SiGe HBT by increasing the photolithographic alignment margin. Referring to FIG. 3B, the result of step 230 of flowchart 200 is illustrated by structure 330.

Continuing with step 235 in FIG. 2 and structure 335 in FIG. 3B, at step 235 of flowchart 200, a thin layer of silicon oxide, i.e. intermediate oxide layer 316, is conformally deposited over sacrificial post 314, inner spacers 317 and 318, outer spacers 327 and 328, and exposed areas of top surface 324 of base 327. Intermediate oxide layer 316 functions as an insulation layer to provide protection for base 327. In one embodiment, the thickness of intermediate oxide layer 316 may be approximately 300.0 to 400.0 Angstroms. Next, amorphous layer 321 is conformally deposited over intermediate oxide layer 316. Amorphous layer 321 may comprise amorphous silicon. In other embodiments, amorphous layer 321 may be replaced by a layer composed of amorphous SiGe or amorphous silicon carbide. Antireflective coating ("ARC") layer 322 is then conformally deposited over amorphous layer 321. ARC layer 322 may comprise an inorganic material such as silicon oxynitride, for example. The addition of ARC layer 322 provides a number of functions, such as the reduction of "subsurface reflection," which degrades image definition of the photoresist by exposing portions of photoresist not intended to be exposed. Degradation of image definition is a factor in loss of dimensional control of features during photolithography. More specifically, ARC layer 322 provides enhanced photolithographic control over printing of an emitter window opening in a subsequent step. Referring to FIG. 3B, the result of step 235 of flowchart 200 is illustrated by structure 335.

Referring to step 240 in FIG. 2 and structure 340 in FIG. 3C, at step 240, a layer of masking material, i.e. emitter window clear-out layer 352, is deposited over the surface of structure 335. Emitter window clear-out layer 352 may comprise a masking material such as photoresist. Emitter window clear-out opening 353 is then aligned, patterned and etched emitter window clear-out layer 352. In the present embodiment, a photolithography process may be utilized to align and pattern emitter window clear-out opening 353 on emitter window clear-out layer 352. Emitter window clear-out width 354 refers to the width of opening 353 in emitter window clear-out layer 352. In the present invention, emitter window clear-out width 354 is designed to be sufficiently wide to ensure exposure of sacrificial post 314 after accounting for the alignment tolerance of the photolithography. For example, if sacrificial post 314 is 200.0 nm wide and the alignment tolerance of the photolithography is plus or minus 85.0 nm, then emitter window clear-out width 354 should be at least 370.0 nm. Accordingly, the spacer width must be at least 85.0 nm on each side of sacrificial post 314 in order to protect base 327 from being damaged due to misalignment. In other words, the combined width of inner spacer 317 and outer spacer 327 must be at least 85.0 mn, and the combined width of inner spacer 318 and outer spacer 328 must also be at least 85.0 nm to protect base 327 from being damaged due to misalignment. Referring to FIG. 3C, the result of step 240 of flowchart 200 is illustrated by structure 340.

Continuing with step 245 in FIG. 2 and structure 345 in FIG. 3B, at step 245 of flowchart 200, the formation of emitter window opening 368 occurs through a series of incremental, selective etching steps, which eventually terminate at top surface 324 of base 327. Step 245 begins with the patterning and etching of a target region in ARC layer 322 to expose amorphous layer 314. By utilizing a selective etch process as known in the art, only ARC layer 235 is etched, and amorphous layer 321 acts as an etch stop layer for the selective etch process. Next, emitter window opening 368 is extended by selective etching of amorphous layer 321. During the selective etching of amorphous layer 321, intermediate oxide layer 316 acts as an etch stop layer. Intermediate oxide layer 316 is then selectively etched in a manner known in the art to expose sacrificial post 314, further extending emitter window opening 368. During the selective etch of intermediate oxide layer 316, sacrificial post 314 acts as an etch stop layer. Next, sacrificial post 314 is selectively etched in a manner known in the art, exposing base oxide layer 312, and further extending emitter window opening 368. During selective etching of sacrificial post 314, the vertical sidewalls of inner spacers 317 and 318 may experience some lateral etching. In the present embodiment, base oxide layer 312 may be etched, for example, utilizing a HF wet etch. During the selective etch of base oxide layer 312, top surface 324 of base 327 provides an etch stop. The selective etch of base oxide layer 312 completes the formation of emitter window opening 368. Referring to FIG. 3C, the result of step 245 of flowchart 200 is illustrated in structure 345.

Continuing with step 250 in FIG. 2 and structure 350 in FIG. 3C, in step 250, emitter 326 is formed by depositing a polycrystalline material in emitter window opening 368 between inner spacers 317 and 318 on top surface 324 of base 327. In one embodiment, emitter 326 can comprise N-type polycrystalline silicon and can have a width substantially equal to emitter window opening 368. Referring to FIG. 3C, the result of step 250 of flowchart 200 is illustrated by structure 350.

In the manner described above, the present invention provides improved photolithographic alignment margin without compromising the base resistance. In contrast to conventional approaches which undesirably sacrifice base resistance to achieve adequate photolithographic alignment margin, the present invention advantageously achieves adequate photolithographic alignment margin without undesirably reducing base resistance. The present invention utilizes inner spacers 317 and 318 and outer spacers 327 and 328 to achieve independent control of two self-aligned base implants, i.e. first base implant 332 and second base implant 334. As such, the present invention provides improved device manufacture inability and greater control of the extrinsic base region in a bipolar transistor such as a SiGe HBT.

It is appreciated by the above detailed disclosure that the invention provides method for improved alignment tolerance in a bipolar transistor such as a SiGe HBT though the invention is described as applied to the fabrication of a heterojunction bipolar transistor, it will be readily apparent to a person of ordinary skill in the art how to apply the invention in a similar situation where improved alignment tolerance is desirable.

From the description of the above invention it is evident that various techniques can be used for implementing the concepts of the present invention without departing from its scope and spirit. Moreover, while the invention has been described with specific reference to certain embodiments, a person of ordinary skills in the art would recognize that, changes made in form and detail without departing from the spirit and scope of the invention. For example, as stated above, layer 321 can be replaced with alternative layers comprised of amorphous SiGe, amorphous silicon carbide, or even a non-amorphous layer such as a layer comprising polycrystalline silicon or polycrystalline silicon carbide, without departing from the scope of the present invention.

The described embodiments are to be considered in all respects as illustrative and not restrictive. For example, although in the specific embodiment of the invention described above, emitter 326 was described as a polycrystalline emitter, it is possible to use an amorphous silicon emitter which is re-crystallized to form a polycrystalline silicon emitter, or to even use a single crystal silicon emitter fabricated by, for example, an "MBE" ("Molecular Beam Epitaxy") or an "MOCVD"("Metal Organic Chemical Vapor Deposition") technique. Therefore, it should be understood that the invention is not limited to the particular embodiments described herein, but is capable of many rearrangements, modifications, and substitutions without departing from the scope of the invention.

Thus, method for improved alignment tolerance in a bipolar transistor and related structure have been described.

What is claimed is:

1. A bipolar transistor comprising:

a base having a top surface;

a first inner spacer and a second inner spacer situated on said top surface of said base;

a first outer spacer situated adjacent to said first inner spacer and a second outer spacer situated adjacent to said second inner spacer on said top surface of said base;

an emitter situated between said first inner spacer and said second inner spacer;

wherein said first and said second outer spacers are situated over an implanted dopant region of said base and said first and said second inner spacers are not situated over said implanted dopant region of said base.

2. The bipolar transistor of claim 1 wherein said implanted dopant is boron.

3. The bipolar transistor of claim 1 wherein said first and said second inner spacers comprise silicon oxide.

4. The bipolar transistor of claim 1 wherein said first and said second outer spacers comprise silicon oxide.

5. The bipolar transistor of claim 1 further comprising an intermediate oxide layer situated on said first and said second outer spacers.

6. The bipolar transistor of claim 5 wherein said intermediate oxide layer comprises silicon oxide.

7. The bipolar transistor of claim 5 further comprising an amorphous layer situated on said intermediate oxide layer.

8. The bipolar transistor of claim 7 wherein said amorphous layer comprises amorphous silicon.

9. The bipolar transistor of claim 7 further comprising an antireflective coating layer situated on said amorphous layer.

10. The bipolar transistor of claim 9 wherein said antireflective coating layer comprises silicon oxynitride.

11. The bipolar transistor of claim 1 wherein said emitter comprises polycrystalline silicon.

12. The heterojunction bipolar transistor of claim 1 wherein said bipolar transistor is an NPN silicon-germanium heterojunction bipolar transistor.

\* \* \* \* \*